United States Patent
Handt et al.

(10) Patent No.: US 11,476,656 B2
(45) Date of Patent: Oct. 18, 2022

(54) OVERCURRENT DETECTION IN AN ELECTRONIC SWITCH

(71) Applicant: Siemens Aktiengesellschaft, Munich (DE)

(72) Inventors: Karsten Handt, Berg (DE); Stefan Hänsel, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/294,307

(22) PCT Filed: Nov. 12, 2019

(86) PCT No.: PCT/EP2019/081056
§ 371 (c)(1),
(2) Date: May 14, 2021

(87) PCT Pub. No.: WO2020/099426
PCT Pub. Date: May 22, 2020

(65) Prior Publication Data
US 2022/0021198 A1    Jan. 20, 2022

(30) Foreign Application Priority Data
Nov. 16, 2018  (EP) ..................................... 18206763

(51) Int. Cl.
*H02H 3/087*     (2006.01)
*H02H 1/00*      (2006.01)

(52) U.S. Cl.
CPC .......... *H02H 3/087* (2013.01); *H02H 1/0007* (2013.01)

(58) Field of Classification Search
CPC .. H02H 3/08; H02H 3/087; H02H 7/18; H02J 7/0029; H02J 7/00304; H02J 1/00–16; H03K 17/6871
See application file for complete search history.

(56) References Cited

U.S. PATENT DOCUMENTS 6,313,513 B1    11/2001  Imanishi et al.
2012/0098573 A1*   4/2012  Sasaki ................ G01R 19/0092
                                                327/103
(Continued)

FOREIGN PATENT DOCUMENTS

DE          102 10 181 C1    7/2003
DE      10 2015 105 192 A1   10/2016
(Continued)

OTHER PUBLICATIONS

Empringham Lee et al: "Design Challenges in the Use of Silicon Carbide JFETs in Matrix Converter Applications", IEEE Transactions on Power Electronics, Institute of Electrical and Electronics Engineers, USA, vol. 29, No. 5, pp. 2563-2573, XP011536970, ISSN: 0885-8993, DOI: 10.1109/TPEL.2013.2290835; [gefunden am Jan. 10, 2014]; Figures 15; 2014.
(Continued)

*Primary Examiner* — Jared Fureman
*Assistant Examiner* — Christopher J Clark
(74) *Attorney, Agent, or Firm* — Henry M. Feiereisen LLC

(57) ABSTRACT

An electronic switch is composed of two anti-serially connected turn-off semiconductor switches having at least four terminals and at least three terminals, respectively. A method for detecting a turn-off current through the electronic switch for a DC voltage grid includes measuring a first voltage between an emitter terminal and an auxiliary emitter terminal at the first switch, measuring a second voltage between a collector terminal and an emitter terminal or between a drain terminal and a source terminal at the second switch, comparing the first and second measured voltage or a time integral of the first and second measured voltage with a reference value, and turning off at least one of the two turn-off semiconductor switches when the reference value is
(Continued)

exceeded. An electronic switch for performing the method and a DC voltage grid with such an electronic switch are also disclosed.

10 Claims, 2 Drawing Sheets

(56) References Cited

U.S. PATENT DOCUMENTS

| | | | |
|---|---|---|---|
| 2013/0063188 A1* | 3/2013 | Sogo | H03K 17/0828 |
| | | | 327/109 |
| 2015/0326222 A1 | 11/2015 | Niemi et al. | |
| 2017/0019099 A1 | 1/2017 | Nam et al. | |
| 2017/0163033 A1* | 6/2017 | Jang | H03K 17/08122 |
| 2018/0026517 A1 | 1/2018 | Mondzik et al. | |
| 2019/0137547 A1* | 5/2019 | Muraho | H03K 17/063 |
| 2020/0136604 A1* | 4/2020 | Schierling | H03K 17/602 |

FOREIGN PATENT DOCUMENTS

| | | |
|---|---|---|
| EP | 2 444 817 A2 | 4/2012 |
| EP | 3 118 995 A1 | 1/2017 |
| JP | 2004 312907 A | 11/2004 |
| JP | 2017 011612 A | 1/2017 |
| KR | 101085864 B1 | 11/2011 |

OTHER PUBLICATIONS

Klumpner Christian et al: "New Solutions for a Low-Cost Power Electronic Building Block for Matrix Converters", IEEE Transactions on Industrial Electronics, IEEE Service Center, Piscataway, NJ, USA, vol. 49, No. 2, XP011073693, ISSN: 0278-0046; Section IV: "A Power electronic building block for matrix converters"; Figures 2,4; Table 1; 2002.
PCT International Search Report and Written Opinion of International Searching Authority dated Jul. 4, 2020 corresponding to PCT International Application No. PCT/EP2019/081056 filed Dec. 11, 2019.

* cited by examiner

OVERCURRENT DETECTION IN AN ELECTRONIC SWITCH

CROSS-REFERENCES TO RELATED APPLICATIONS

This application is the U.S. National Stage of International Application No. PCT/EP2019/081056, filed Nov. 12, 2019, which designated the United States and has been published as International Publication No. WO 20201099426 A1 and which claims the priority of European Patent Application, Serial No. 18206763.7, filed Nov. 16, 2018, pursuant to 35 U.S.C. 119(a)-(d).

BACKGROUND OF THE INVENTION

The invention relates to a method for detecting a turn-off current through an electronic switch, wherein the electronic switch comprises two turn-off semiconductor switches. Furthermore, the invention relates to an electronic switch comprising two turn-off semiconductor switches for carrying out the method. The invention furthermore relates to a DC voltage grid comprising such an electronic switch.

Nowadays supply with electrical energy primarily takes place via AC voltage grids. The latter have the advantage that different voltage levels can be established with the aid of transformers. Semiconductors that are becoming commercially available more and more cost-effectively enable different voltage levels to be generated in a simple manner for DC voltage grids, too, such that energy supplied via DC voltage grids, in particular within industrial networks, is indeed also becoming particularly economic.

In this case, in future industrial installations, DC grids are intended to reduce losses, ensure the direct exchange of energy between convertors, storage units and motors and to achieve increased robustness. In this case, it is possible to operate for example small DC voltage grids, also referred to as DC voltage grids, with different cable lengths between the various load outgoers and infeeds. DC grids, in comparison with AC grids, may in this case have a significantly greater variance in the supply line inductance and thus in the current rise in the case of a short circuit, since here, on the one hand, no short-circuit impedance of an upstream transformer has an effect of limiting a short-circuit current, rather energy storage units in the form of capacitive voltage links as ideal voltage sources can generate very large current rises in the case of a short circuit. On the other hand, very long supply lines do not pose the problem of increasing reactive power as a result of an increase in reactance and large series inductances are thus entirely permissible, which permit only very small current rises in the case of a short circuit, but cause large overvoltages during switching.

The invention is based on the object of realizing reliable overcurrent detection for an electronic switch.

SUMMARY OF THE INVENTION

This object is achieved by means of a method for detecting a turn-off current through an electronic switch, wherein the electronic switch comprises at least one turn-off semiconductor switch, wherein the turn-off semiconductor switch comprises at least three terminals, wherein a voltage is measured between two of the at least three terminals, wherein the voltage or the temporal integral of the voltage is compared with a reference value and at least one of the at least one turn-off semiconductor switch is turned off in the event of the reference value being exceeded. Furthermore, this object is achieved by means of an electronic switch comprising at least one turn-off semiconductor switch, wherein the turn-off semiconductor switch comprises at least three terminals, wherein the electronic switch comprises a voltage sensing means for measuring a voltage between two of the at least three terminals, wherein the electronic switch comprises an evaluation unit, wherein the measured voltage is able to be compared with a reference value by means of the evaluation unit, wherein the at least one turn-off semiconductor switch is able to be turned off by means of the evaluation unit in the event of the reference value being exceeded. This object is further achieved by means of a DC voltage grid comprising such an electronic switch.

Further advantageous configurations of the invention are specified in the dependent claims.

The invention is based on the insight that present-day current convertors are suitable only to a limited extent for measuring the current through an electronic switch situated in a DC grid. Known types of DC sensors, such as Hall effect or magnetoresistive sensors, for example, have a relatively low cut-off frequency, typically in the region of 400 kHz and dead times in the range of 500 ns to 1500 ns. In the case of grids of very low inductance, in this time period the current in the case of a fault, such as a short circuit, for example, can very rapidly reach high values that can result in the destruction or malfunction of the semiconductor.

In this regard, in one example, given a DC voltage of the DC voltage grid of 800 V and an assumed supply line having a length of 2 m, corresponding to an inductance of approximately 1 μH, a current rise of $$i(t)=(U/L)*\Delta t=(800 \text{ V}/1 \text{ μH})*1.5 \text{ μs}=1200 \text{ A}$$

can arise. Consequently, the known current convertors are suitable only to a limited extent for ensuring reliable protection of the electronic switch and of the components arranged in the outgoer of the electronic switch in a DC voltage grid.

It has been found, however, that for protection and thus for triggering, i.e. opening, of the electronic switch, a rapid response of the current detection is important rather than a high accuracy. It has furthermore been found that by measuring voltages at the turn-off semiconductor switch, it is possible very rapidly to detect an impermissibly high current that is to be turned off by the electronic switch.

It has furthermore been found that a high current or a high current rise can be reliably detected by measuring voltages at the terminals of the turn-off semiconductor switch.

The turn-off semiconductor switch has at least three terminals. In the case of semiconductors based on transistors such as IGBTs, these terminals are referred to as gate (G) or base, collector (C) and emitter (E), and as gate, drain and source in the case of a MOSFET. This method according to the invention functions both for turn-off semiconductor switches comprising gate (G), collector (C) and emitter (E) and for those comprising gate, drain and source, wherein a base terminal present can also be used as gate terminal In this case, the gate terminal of the IGBT corresponds to the gate terminal of the MOSFET or to a base terminal of a transistor, the collector terminal corresponds to the drain terminal and the emitter terminal corresponds to the source terminal. The gate, drain and source terminals will not be discussed any more below. However, the explanations regarding gate (G) or base, collector (C) and emitter (E) with regard to overcurrent detection are straightforwardly applicable to the gate, drain and source terminals for all exemplary embodiments. The same applies to the auxiliary emitter terminal introduced later.

It has been found that high currents or high rates of rise of currents can be reliably detected by way of the voltages between two of the terminals of the turn-off semiconductor switch. If the measured value or the integral of the measured value exceeds a reference value, also referred to as limit value, then the turn-off semiconductor switch transitions to the nonconducting state and the electronic switch is open. In this case, the reference value or limit value can be predefined and stored in the evaluation unit. By means of the evaluation unit, the measured value of the voltage or its integral is compared with the reference value.

While a current through the semiconductor is detectable by means of a measurement of the voltage between collector and emitter, the current rise through the turn-off semiconductor is measurable by means of a measurement between the emitter and an auxiliary emitter as fourth terminal of the turn-off semiconductor switch. Said current rise can already be used for protection by way of comparison with the reference value, since a short circuit is already detected reliably on the basis of a large current rise. If, by contrast, instead of the current rise, there is a desire to make the turn-off of the electronic switch dependent on the current magnitude during measurement of the voltage between emitter and auxiliary emitter, then instead of the measured voltage value the time integral over the measured voltage is to be compared with the reference value. The formation of the time integral able to be carried out by the evaluation unit of the electronic switch without any problems.

Turning off a turn-off semiconductor switch is understood to mean that the turn-off semiconductor switch is put into the nonconducting state.

If more than only one voltage is measured and/or a voltage is measured and both the value of the measurement and the time integral are used for determining the turn-off criterion, the reference values for the respective comparison can differ.

In the case of the two semiconductor switches, a distinction is drawn between a first and a second of the two semiconductor switches.

In the case of the second semiconductor switch, the voltage between a collector terminal and an emitter terminal or between a drain terminal and a source terminal of the at least one turn-off semiconductor switch is measured. Here the collector-emitter voltage ($U_{CE}$) or the drain-source voltage ($U_{DS}$) is measured in the on state of the turn-off semiconductor, if there is a high current through the turnoff semiconductor switch, a voltage builds up between the collector and emitter terminals. If said voltage becomes greater than a reference value, also referred to as limit value, said current is detected as an overcurrent and the turn-off semiconductor switch is turned off, if the turn-off semiconductor switch is already at saturation in the event of said reference value being reached, then the overcurrent can be detected particularly simply since the voltage in this range rises distinctly with the current intensity. However, it has also been found that even before saturation the voltage between collector and emitter already rises with the current through the semiconductor. Although the metrological detection of such a voltage change is more difficult than in the saturated range, it is in any case still metrologically determinable. On the basis of the collector-emitter voltage it is possible, in a simple manner and primarily sufficiently rapidly, to detect a high current through the turn-off semiconductor switch and to react by turning off the turn-off semiconductor switch. Said high current may be caused by a short circuit, for example, which rapidly causes a high current on account of the low inductances in the DC voltage grid. By means of the rapid overcurrent detection by means of measuring the collector-emitter voltage the overcurrent can and comparing with a reference value the overcurrent can be detected reliably and rapidly. As a result, the advantages of the electronic switch, in particular its fast switching time in the region of 100 ns, can be utilized particularly advantageously.

The current mapping by way of the voltage is particularly good if the turn-off semiconductor switch is at saturation. Therefore, this embodiment is suitable in particular for turn-off currents that are close to the loading limit of the turn-off semiconductor.

In this case, the first of the turn-off semiconductor switches comprises at least four terminals, wherein the voltage is measured between the emitter terminal and an auxiliary emitter terminal of the at least one turn-off semiconductor switch. In this case, the turn-off semiconductor switch comprises an auxiliary emitter, or an auxiliary source, as an additional terminal, i.e. as a fourth terminal. In this case, the voltage is measured between the emitter or source, also referred to as main emitter, and the auxiliary emitter. If a current with a very great rise then flows through the collector-emitter path of the turn-off semiconductor switch, a voltage is dropped across a supply line inductance $L_E$ within the semiconductor, which voltage is proportional to the current rise. If this measured voltage is integrated, which can be realized very simply in terms of digital technology, a value proportional to the current through the turn-off semiconductor switch is obtained. Moreover, if the value of the supply line inductance $L_E$ is additionally known, even the exact value of the current is calculable. The latter is not absolutely necessary, however; all that is required is a reference value which, when exceeded, reliably detects the overcurrent. This method, too, manages without a current convertor and is particularly fast, such that rapidly rising currents can be detected certainly and reliably and particularly rapidly. As a result, by virtue of this embodiment, too, the advantages of the electronic switch, in particular its fast switching time in the region of 100 ns, can be utilized particularly advantageously.

Furthermore, this method by way of the measurement of the voltage between emitter and auxiliary emitter is able to be carried out using simple voltage sensors even if the semiconductor is not yet at saturation. This method is thus suitable in particular for turn-off currents that are distinctly below the loading limit of the turn-off semiconductor switch.

Furthermore, it has proved to be advantageous also to carry out traditional current measurement by means of a current sensor, since slowly rising current rises can thus be detected. This current measurement can then be realized in combination with the detection by way of measured voltages between collector and emitter and by way of a measurement between emitter and auxiliary emitter particularly reliable short-circuit protection for an electronic switch over a wide range of series inductance, also referred to as supply line inductances, and overcurrent scenarios. In this case, both the voltage between collector and emitter and the voltage between emitter and auxiliary emitter are measured at the turn-off semiconductor. This yields, together with the relatively slow measurement by means of the current sensor, a three-stage protection concept for establishing the operational reliability of the electronic switch in all known overcurrent situations. The reference values for comparison with the measured voltages and/or the time integral thereof may differ here for each measurement.

In summary, the object on which the invention is based is particularly advantageously achieved by means of the method for detecting a turn-off current through an electronic switch in that the electronic switch comprises two turn-off semiconductor switches, wherein the two turn-off semiconductor switches are arranged in such a way that they can each turn off a current having a different polarity through the electronic switch, in particular wherein the two turn-off semiconductor switches are arranged in antiseries in the electronic switch, wherein a first of the turn-off semiconductor switches comprises at least four terminals, wherein a second of the turn-off semiconductor switches comprises at least three terminals, wherein at the first of the two turn-off semiconductor switches a first voltage is measured between an emitter terminal and an auxiliary emitter terminal and at a second of the two turn-off semiconductor switches a second voltage is measured between a collector terminal and an emitter terminal or between a drain terminal and a source terminal, wherein the measured voltage or the time integral of the measured voltage is compared in each case with a reference value and at least one of the two turn-off semiconductor switches is turned off in the event of the reference value being exceeded. Furthermore, the object is achieved by means of an electronic switch comprising two turn-off semiconductor switches, wherein the two turn-off semiconductor switches are arranged in such a way that they can each turn off a current having a different polarity through the electronic switch, in particular wherein the two turn-off semiconductor switches are arranged in antiseries in the electronic switch, wherein a first of the turn-off semiconductor switches comprises at least four terminals, wherein a second of the turn-off semiconductor switches comprises at least three terminals, wherein the electronic switch comprises a voltage sensing means for measuring a first voltage between an emitter terminal and an auxiliary emitter terminal at the first of the two turn-off semiconductor switches and a second voltage between a collector terminal and an emitter terminal or between a drain terminal and a source terminal at the second of the two turn-off semiconductor switches, wherein the electronic switch comprises an evaluation unit configured to compare the measured voltage or the time integral of the measured voltage in each case with a reference value and to turn off at least one of the two turnoff semiconductor switches in the event of the reference value being exceeded.

In one advantageous configuration of the invention, the electronic switch comprises two turn-off semiconductor switches, wherein at the two turn-off semiconductor switches in each case the voltage is measured between two terminals, wherein the relevant turnoff semiconductor switch is turned off in the event of the reference value being exceeded. In this case, the two turn-off semiconductor switches are arranged such that they can each turn off a current having a different polarity through the switch. If the turn-off semiconductor switches are reverse blocking semiconductor switches, the latter are arranged in a parallel circuit in which for each current direction in each case one of the two turn-off semiconductor switches can carry and turn off the current. Said parallel circuit is also referred to as an antiparallel circuit, or the arrangement is referred to as antiparallel. For the case where the turn-off semiconductor switches are reverse conducting, recognizable in the circuit diagram from a diode arranged in antiparallel with the switching element, then the two turn-off semiconductor switches are arranged in a series circuit in which in one current direction the current flows through the switching element of the first of the two turnoff semiconductor switches and through the diode of the second of the two turn-off semiconductor switches. In the opposite current direction, i.e. in the case of opposite polarity of the current, the current flows through the switching element of the second of the two turnoff semiconductor switches and through the diode of the first of the two turnoff semiconductor switches. This arrangement is also referred to as antiseries. At both of the turnoff semiconductor switches, the voltage can then be measured at two of the terminals. This can be done at the same terminals in each case, or else at different terminals. The reference value, i.e. the limit value, with which the measured voltage is compared can likewise be identical or different. In this case, after the reference value has been exceeded, only the affected turnoff semiconductor switch may be turned off or both turnoff semiconductor switches are turned off.

With different reference values, direction-dependent protection can thus be realized in a simple manner. In this case, the permissible current is greater in one direction through the electronic switch than in the other direction. It is then also the case that only the turn-off semiconductor switch at which the reference value is exceeded is turned off. Consequently, for example, short-circuit protection for the loads connected to the DC source via the electronic switch can have a lower limit value for the current from the source to the load, while a higher reference value is provided in the case of the opposite current direction, that is to say from the load to the DC source, in order that a short circuit occurring elsewhere in the DC voltage grid does not switch off the electronic switch, in outgoers in which no short circuit at all is present. What can be achieved by this selectivity is that rapidly only the outgoer affected by a short circuit turns off, while the electronic switches of the other outgoers remain switched on in order that the intact parts of the DC voltage grid continue to be kept operational even if momentarily a higher current flows in these parts on account of the short circuit in the other outgoer. The operation of undisturbed parts of the DC voltage grid can thus continue to be ensured in a simple manner.

What is particularly advantageous is, as already explained above, the three-stage protection for each of the two turn-off semiconductor switches. For this purpose, besides the current sensor at both semiconductor switches the voltage between collector and emitter and the voltage between emitter and auxiliary emitter are respectively measured and compared with respective reference values. This affords good protection for all conceivable fault situations in the DC voltage grid.

According to the invention, a first of the turn-off semiconductor switches comprises at least four terminals, wherein at the first of the two turn-off semiconductor switches the voltage is measured between an emitter terminal and an auxiliary emitter terminal and at a second of the two turn-off semiconductor switches the voltage is measured between a collector terminal and an emitter terminal. In this case, it has proved to be advantageous if the voltage sensing means is designed for measuring the voltage between an emitter terminal and an auxiliary emitter terminal of a first of the two turnoff semiconductor switches and for measuring the voltage between a collector terminal and an emitter terminal of a second of the two turn-off semiconductor switches. This arrangement enables selective protection in a particularly simple manner. For the turn-off current from the DC source to the load, a lower reference value, i.e. limit value, is provided for the turn-off semiconductor switch that can carry and turn off this current. This is done by way of the voltage measurement at emitter and auxiliary emitter. This measurement is particularly advantageous in this range of the turn-off current. It is likewise possible for triggering to be performed here not just upon a current value being reached, but rather on account of the high rate of current rise that is typical of a short circuit. The triggering on account of the high rate of rise is effected by way of a comparison of the measured voltage with the reference value. The triggering on account of the current magnitude is effected by way of a comparison of the time integral of the measured voltage with the reference value.

For the opposite polarity, at the second turnoff semiconductor switch, which can carry and turn off this current, it is possible to measure the voltage at collector and emitter. On account of the higher turn-off current, the turn-off semiconductor then already attains saturation, and so this measurement can likewise be carried out with high accuracy. For this direction, the change in the current is moreover unimportant, and so the measurement between emitter and auxiliary emitter can be dispensed with.

In a further advantageous configuration of the invention, the relevant turnoff semiconductor switch is turned off in the event of the reference value being exceeded. The protection can thus be implemented in a direction-selective manner. By way of example, only the uptake of electrical energy from a DC source may be interrupted, while feedback of energy into a DC voltage grid is still possible, provided that this limit value is not exceeded.

In a further advantageous configuration of the invention, for selective protection the first measured voltage and/or the integral of the first measured voltage are/is compared with a first reference value and the second measured voltage is compared with a second reference value, wherein the relevant turn-off semiconductor switch is turned off or both turn-off semiconductor switches are turned off in the event of the respective reference value being exceeded. Thus a first limit value can be predefined for a first direction of the current and a second limit value can be predefined for the opposite current direction. The limit value can be a limit value for the current rise and/or a current. If the measured voltage and the integral of the measured voltage are evaluated, the reference value can comprise a limit value for a current and a limit value for a rate of current rise. In this exemplary embodiment, not only is it possible for the protection to be effected in a direction-selective manner, but it is also possible for a dedicated limit value to be predefined for each current direction. In this case, the switch can especially be adapted to the prevailing grid conditions or to the connected loads or electrical consumers.

In a further advantageous configuration of the invention, for selective protection the integral of the first measured voltage is compared with a first reference value wherein the first reference value is less than the second reference value. Here a current can be uniquely assigned to both reference values. In this case, the two reference values are comparable with one another and the first reference value can be chosen to be less than the second reference value since smaller current values can be detected better by way of the first measured voltage than by way of the second measured voltage.

In a further advantageous configuration of the invention, at the first semiconductor switch a third voltage is additionally measured between the collector terminal and the emitter terminal and the first semiconductor switch is turned off in the event of a third limit value being exceeded. By virtue of the additional measurement of the third voltage, the protection afforded by the electronic switch can be realized particularly certainly and reliably since it is embodied in a multi-stage fashion.

In a further advantageous configuration of the invention, the electronic switch is arranged between a DC source and a load in such a way that a current from the DC source to the load is able to be turned off by means of the first semiconductor switch and a current from the load to the DC source is able to be turned off by means of the second semiconductor switch. In this configuration, the advantages of the electronic switch can be utilized particularly well. A current from the DC source to the load can be turned off reliably and rapidly, particularly if the current is a short-circuit current caused by the relevant load that is intended to be safeguarded by the electronic switch. Short circuits in other load outgoers that cause a current flow from the load in the direction of the DC source would then not result in the electronic switch being opened, since the values are correspondingly set such that the short circuit is detected and interrupted by the relevant switch in the associated load outgoer. The loads free of disturbances can then still remain in operation in the DC voltage grid without any problems and in a reliable manner.

This can be realized in particular in a configuration in which the evaluation unit is configured, for selective protection, to compare the integral of the first measured voltage with a first reference value and to compare the second measured voltage with a second reference value and to turn off the relevant turn-off semiconductor switch in the event of the respective reference value being exceeded, wherein the first reference value is less than the second reference value.

BRIEF DESCRIPTION OF THE DRAWING

The invention is described and explained in greater detail below on the basis of the exemplary embodiments illustrated in the figures, in which.

DETAILED DESCRIPTION OF PREFERRED EMBODIMENTS

Figure 1:
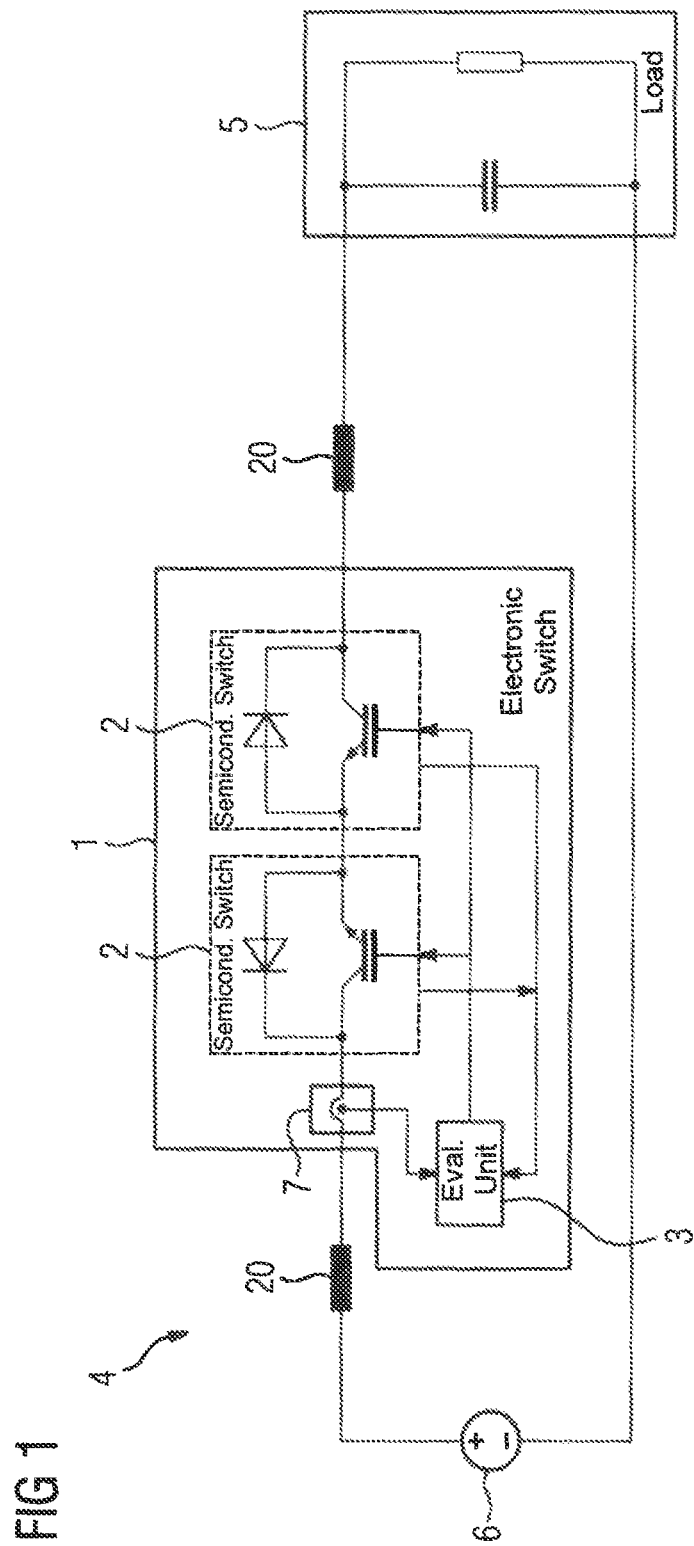
FIG. 1 shows a DC voltage grid with an electronic switch.

FIG. 1 shows a DC voltage grid 4 with a DC source 6, which feeds a load 5 via an electronic switch 1. In this case, the individual lines in the DC voltage grid have a series inductance 20, these firstly limiting the rate of rise of the current in the case of a fault, such as a short circuit, for example. In this exemplary embodiment, the electronic switch/comprises two turn-off semiconductor switches 2, which, because they are reverse conducting, are arranged in antiseries. The two turnoff semiconductor switches 2 are driven by an evaluation unit 3. The latter can switch on the individual turn-off semiconductor switches 2, i.e. put the semiconductor into the conductive state, or turn them off, i.e. put them into the blocking state. In order to detect an overcurrent, the evaluation unit uses measured values from two of the terminals of the respective turn-off semiconductor switch 2. In addition it is possible, albeit not necessarily, for the signal of a current sensor 7 also to be evaluated as well. Said current sensor 7 can be situated within the electronic switch 1 or outside.

Figure 2:
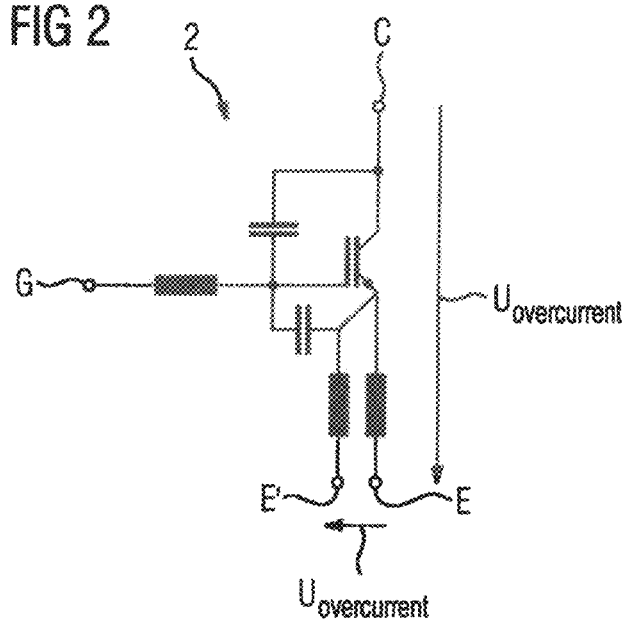
FIG. 2 shows a turn-off semiconductor switch.

FIG. 2 shows a turn-off semiconductor switch 2 with its terminals gate G, collector C and emitter E. Depending on the method used for overcurrent detection, a fourth terminal, the auxiliary emitter E', is also required as well. The current through the electronic switch 1 flows from the collector C to the emitter E. The auxiliary emitter E' serves only for measuring the voltage between emitter E and auxiliary emitter E', but is not used for passing the current through the turnoff semiconductor switch 2. In order to detect an overcurrent, it is possible then to measure the voltage $U_{overcurrent}$ between collector C and emitter E. Alternatively, it is possible also to measure the voltage $U_{overcurrent}$ between the emitter E and the auxiliary emitter E'. The combination, i.e. the measurement of both voltages, can also be carried out in order to make the protection redundant and to be able to react better to different fault situations.

Figure 3:
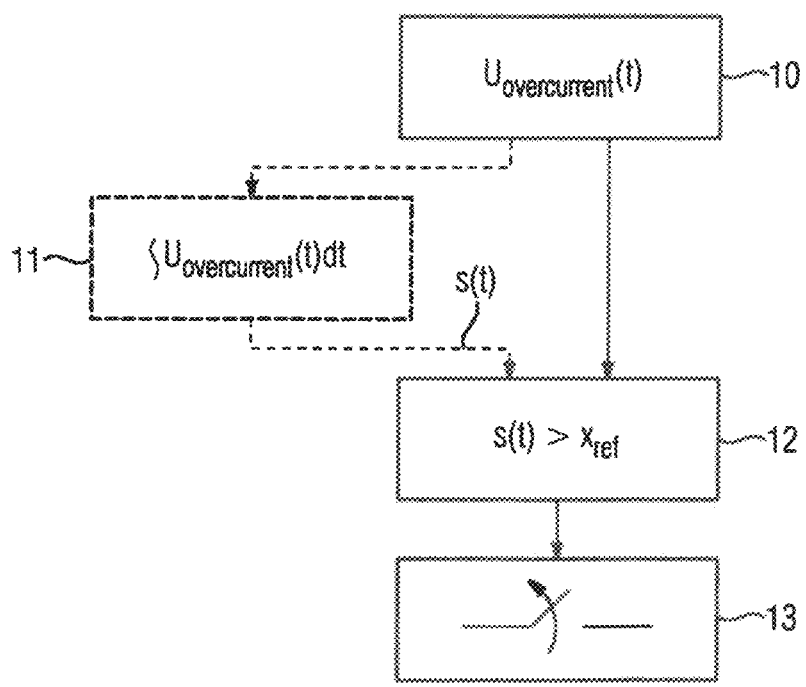
FIG. 3 shows a flow diagram of the method for detecting a turn off current.

FIG. 3 shows the sequence of the method for detecting an overcurrent. in this case, a first step 10 involves measuring the voltage $U_{overcurrent}$ between two terminals C, E, E' of the turn-off semiconductor switch 2. This signal s(t) is then used directly for comparison 12 with a reference value $X_{ref}$. Alternatively or supplementarily, as illustrated by dashed lines, the value of the measured voltage $U_{overcurrent}$ can also be integrated over time. That is to say that the time integral over the measured voltage $U_{overcurrent}$ is formed. This signal s(t), too, is then fed to the comparison 12 with a reference value $X_{ref}$. In this case, from the measurement of the voltage $U_{overcurrent}$ the measured value per se and/or the time integral of the voltage $U_{overcurrent}$ can be fed to the comparison 12 with the reference value $X_{ref}$. If the comparison 12 reveals that the signal s(t) is greater than the associated reference value $X_{ref}$, then the relevant turn-off semiconductor switch at which the voltage $U_{overcurrent}$ was measured or both semiconductor switches is/are turned off 13, i.e. put into the off state. This is indicated by way of the symbol of an opening mechanical switch.

This method is carried out for the two semiconductor switches 2 arranged in antiseries in the electronic switch 1.

This monitoring takes place continuously, preferably in the evaluation unit 3 described above.

In summary, the invention relates to a method for detecting a turn-off current through an electronic switch, wherein the electronic switch comprises at least one turn-off semiconductor switch, wherein the turn-off semiconductor switch comprises at least three terminals. For reliably detecting an overcurrent for the electronic switch, it is proposed that a voltage is measured between two of the at least three terminals, wherein the voltage or the temporal integral of the voltage is compared with a reference value and at least one of the at least one turnoff semiconductor switch is turned off in the event of the reference value being exceeded. Furthermore, the invention relates to an electronic switch comprising at least one turn-off semiconductor switch, wherein the turnoff semiconductor switch comprises at least three terminals, wherein the electronic switch comprises a voltage sensing means for measuring a voltage between two of the at least three terminals, wherein the electronic switch comprises an evaluation unit, wherein the measured voltage is able to be compared with a reference value by means of the evaluation unit, wherein the at least one turn-off semiconductor switch is able to be turned off by means of the evaluation unit in the event of the reference value being exceeded. The invention furthermore relates to a DC voltage grid comprising such an electronic switch.

Overall, the invention relates in summary to a method for detecting a turn-off current through an electronic switch, wherein the electronic switch comprises two turn-off semiconductor switches, wherein the two turn-off semiconductor switches are arranged in such a way that they can each turn off a current having a different polarity through the electronic switch, in particular wherein the two turnoff semiconductor switches are arranged in antiseries in the electronic switch, wherein a first of the turn-off semiconductor switches comprises at least four terminals, wherein a second of the turnoff semiconductor switches comprises at least three terminals, wherein at the first of the two turn-off semiconductor switches a first voltage is measured between an emitter terminal and an auxiliary emitter terminal and at a second of the two turn-off semiconductor switches a second voltage is measured between a collector terminal and an emitter terminal or between a drain terminal and a source terminal, wherein the measured voltage or the time integral of the measured voltage is compared in each case with a reference value and at least one of the two turn-off semiconductor switches is turned off in the event of the reference value being exceeded. Furthermore, the invention relates to an electronic switch for carrying out such a method.

The invention furthermore relates to a DC voltage grid comprising such an electronic switch.

The invention claimed is:

1. A method for detecting a turn-off current through an electronic switch for a DC voltage grid, with the electronic switch comprising two anti-serially connected turn-off semiconductor switches, wherein a first of the two turn-off semiconductor switches has at least four terminals and a second of the turn-off semiconductor switches has at least three terminals, the method comprising:
   measuring at the first of the two turn-off semiconductor switches a first voltage between an emitter terminal and an auxiliary emitter terminal,
   measuring at the second of the two turn-off semiconductor switches a second voltage between a collector terminal and an emitter terminal or between a drain terminal and a source terminal,
   comparing the first and second measured voltage or a time integral of each of the first and second measured voltage with a reference value, and
   turning off at least one of the two turn-off semiconductor switches when the reference value is exceeded.

2. The method of claim 1, wherein the turn-off semiconductor switch exceeding the reference value is turned off.

3. The method of claim 1, further comprising:
   comparing the first measured voltage or the time integral of the first measured voltage with a first reference value associated with the first turn-off semiconductor switch and the second measured voltage with a second reference value associated with the second turn-off semiconductor switch, and
   selectively turning the first or the second turn-off semiconductor switch off when the respective associated first or second reference value is exceeded or turning both first and second turn-off semiconductor switches off when one of the associated reference values is exceeded.

4. The method of claim 3, further comprising
   comparing the time integral of the first measured voltage with the first reference value, wherein the first reference value is less than the second reference value.

5. The method of claim 1, further comprising
   measuring at the first turn-off semiconductor switch a third voltage between a collector terminal and the emitter terminal, and
   turning the first semiconductor switch off when a third limit value is exceeded.

6. The method of claim 5, further comprising
   measuring a current with a current sensor, and
   opening one or both of the two turn-off semiconductor switches independently of the measured voltages when a magnitude of the measured current exceeds a limit value.

7. An electronic switch for a DC voltage grid, comprising
two anti-serially connected turn-off semiconductor switches arranged so as to be able to each turn off a current having a different polarity through the electronic switch, with a first of the two turn-off semiconductor switches comprising at least four terminals and the second of the two turn-off semiconductor switches comprising at least three terminals,
a voltage sensor measuring a first voltage between an emitter terminal and an auxiliary emitter terminal at the first of the two turn-off semiconductor switches and a second voltage between a collector terminal and an emitter terminal or between a drain terminal and a source terminal at the second of the two turn-off semiconductor switches,
an evaluation unit configured to compare each of the measured first and second voltages or a time integral of each of the measured first and second voltages with a reference value and to turn off at least one of the two turn-off semiconductor switches when the reference value is exceeded.

8. A DC voltage grid comprising the electronic switch of claim 7.

9. The DC voltage grid of claim 8, wherein the electronic switch is arranged between a DC source and a load in such a way that a current from the DC source to the load is able to be turned off by the first semiconductor switch and a current from the load to the DC source is able to be turned off by the second semiconductor switch.

10. The DC voltage grid of claim 8, wherein the evaluation unit is configured, for selective protection, to compare the time integral of the first measured voltage with a first reference value and to compare the second measured voltage with a second reference value, and to selectively turn off the first or second turn-off semiconductor switch when the respective first or second reference value is exceeded, wherein the first reference value is less than the second reference value.

* * * * *